(12) United States Patent
Melzer et al.

(10) Patent No.: US 7,034,998 B2
(45) Date of Patent: Apr. 25, 2006

(54) METHOD OF CONNECTING A MULTIPLICITY OF OPTICAL ELEMENTS TO A BASIC BODY

(75) Inventors: Frank Melzer, Utzmemmingen (DE); Ulrich Bingel, Lauterburg (DE)

(73) Assignee: Carl Zeiss Smt AG, Oberkochen (DE)

( * ) Notice: Subject to any disclaimer, the term of this patent is extended or adjusted under 35 U.S.C. 154(b) by 0 days.

(21) Appl. No.: 09/888,214

(22) Filed: Jun. 21, 2001

(65) Prior Publication Data

US 2002/0021507 A1 Feb. 21, 2002

(30) Foreign Application Priority Data

Jun. 21, 2000 (DE) .............................. 100 30 495

(51) Int. Cl.
*G02B 5/08* (2006.01)
*G02B 7/182* (2006.01)

(52) U.S. Cl. ............... 359/350; 359/851; 359/853; 359/855; 359/900; 205/71

(58) Field of Classification Search ............ 359/350, 359/850, 851, 853, 855, 871, 883, 900; 262/2.7; 205/71, 79
See application file for complete search history.

(56) References Cited

U.S. PATENT DOCUMENTS

| | | | | |
|---|---|---|---|---|
| 3,378,469 A | * | 4/1968 | Rex | ............... 205/50 |
| 3,837,125 A | | 9/1974 | Johnson | |
| 3,917,385 A | | 11/1975 | Caswell | |
| 4,038,971 A | * | 8/1977 | Bezborodko | |
| 4,195,913 A | * | 4/1980 | Dourte et al. | ............... 359/853 |
| 4,236,296 A | * | 12/1980 | Woolhouse et al. | |
| 4,277,141 A | | 7/1981 | Kleiber | |
| 4,338,165 A | * | 7/1982 | Vlahos | ............... 156/64 |
| 4,389,115 A | | 6/1983 | Richter | |
| 4,390,260 A | | 6/1983 | Prinz | ............... 354/65 |
| 4,420,223 A | | 12/1983 | Watanabe et al. | ........... 350/310 |
| 4,710,276 A | | 12/1987 | Kull | |
| 4,740,276 A | * | 4/1988 | Marmo et al. | |
| 5,428,482 A | | 6/1995 | Bruning et al. | |
| 5,518,383 A | | 5/1996 | Abiven | ............... 418/48 |
| 5,537,262 A | | 7/1996 | Aoki et al. | |
| 5,564,066 A | | 10/1996 | Abiven | ............... 428/549 |
| 5,891,317 A | * | 4/1999 | Teichmann et al. | |

(Continued)

FOREIGN PATENT DOCUMENTS

CH 371906 10/1963

(Continued)

OTHER PUBLICATIONS

Altmann et al., "Mirror system for the German x-ray satellite ABRIXAS:1. Flight mirror fabrication, integration, and testing," Published Nov. 1998, abstract only.

(Continued)

*Primary Examiner*—Ricky D. Shafer
(74) *Attorney, Agent, or Firm*—Wells St. John, P.S.

(57) ABSTRACT

In a method of connecting a multiplicity of optical elements (9) to a basic body (8), in particular for producing a faceted mirror (1), for example for beam mixing and field imaging for an EUV lighting system, the individual optical elements (9) are positioned on the basic body (8, 14) and subsequently connected to one another by an galvanoplastic process. Alternatively, the multiplicity of optical elements are aligned on an auxiliary structure (11) and the optical elements (9) are subsequently made to grow up galvanoplastically on their rear sides, forming a supporting structure (14) as the basic body.

10 Claims, 3 Drawing Sheets

U.S. PATENT DOCUMENTS

| | | | |
|---|---|---|---|
| 6,118,577 A * | 9/2000 | Sweatt et al. | 359/351 |
| 6,155,868 A | 12/2000 | Wu et al. | 439/495 |
| 6,166,868 A | 12/2000 | Holderer et al. | |
| 6,229,657 B1 | 5/2001 | Holderer et al. | |
| 6,252,712 B1 | 6/2001 | Fürter et al. | |
| 6,259,571 B1 | 7/2001 | Holderer et al. | |
| 6,275,344 B1 | 8/2001 | Holderer | |
| 6,307,688 B1 | 10/2001 | Merz et al. | |
| 6,369,959 B1 * | 4/2002 | Trunz et al. | |
| 6,373,552 B1 | 4/2002 | Braat et al. | |
| 6,503,383 B1 * | 1/2003 | Holderer et al. | |
| 6,552,862 B1 | 4/2003 | Dieker | |
| 6,580,570 B1 | 6/2003 | Becker et al. | |
| 6,603,615 B1 | 8/2003 | Melzer et al. | |
| 6,824,277 B1 | 11/2004 | Freitag et al. | 359/507 |
| 2002/0001142 A1 | 1/2002 | Osterried | |
| 2002/0021504 A1 | 2/2002 | Bayer et al. | |

FOREIGN PATENT DOCUMENTS

| | | |
|---|---|---|
| DD | 204 320 | 11/1983 |
| DE | 1 146 667 | 4/1963 |
| DE | 1 675 685 | 1/1970 |
| DE | 26 37 725 | 2/1978 |
| DE | 2727563 * | 4/1978 |
| DE | 30 30 549 A1 | 2/1982 |
| DE | 3406907 A 1 | 10/1984 |
| DE | 41 36 580 A1 | 5/1993 |
| DE | 196 49 993 A1 | 5/1998 |
| DE | 197 35 831 A1 | 2/1999 |
| DE | 199 08 554.4 | 3/1999 |
| DE | 198 25 716 A 1 | 12/1999 |
| DE | 199 10 947 A 1 | 9/2000 |
| DE | 10107674 | 9/2002 |
| DE | 10123585 | 12/2002 |
| DE | 10132408 | 2/2003 |
| DE | 10134559 | 2/2003 |
| DE | 10153541 | 5/2003 |
| DE | 10153542 | 5/2003 |
| DE | 10135962 | 6/2003 |
| DE | 10302771 | 8/2004 |
| EP | 0 053 463 A2 | 6/1982 |
| EP | 0 143 014 A1 | 5/1985 |
| EP | 0 230 277 A2 | 7/1987 |
| EP | 0 597 209 A1 | 9/1993 |
| EP | 0 624 807 A1 | 11/1994 |
| EP | 0767246 | 4/1997 |
| EP | 0898189 * | 2/1999 |
| EP | 0 964 281 A1 | 12/1999 |
| EP | 1 209 500 A2 | 5/2002 |
| GB | 2 010 523 A | 6/1979 |
| JP | 2002071922 | 3/2002 |
| JP | 2002270502 | 9/2002 |

OTHER PUBLICATIONS

Wolf et al., "Herstellung eines Neutronenspiegels mittels Galvanoformung," Published 1989, no translation, pp 1845.

Egle et al., "Production and testing of development mandrels for Constellation-X," Published SPIE 2000, abstract & intro. only.

Merriam-Webster Online, www.m-w.com/dictionary. definitions pages for: between and indicate, 2 pages.

LEO Online, www.dict.leo.org, translation pages for: between and indicate, 4 pages.

* cited by examiner

METHOD OF CONNECTING A MULTIPLICITY OF OPTICAL ELEMENTS TO A BASIC BODY

CROSS REFERENCE TO RELATED APPLICATION

This application relates to and claims priority to corresponding Germany Patent Application No. 100 30 495.8, which was filed on Jun. 21, 2000, and which is incorporated by reference herein.

BACKGROUND OF THE INVENTION

The invention relates to a method of connecting a multiplicity of optical elements to a basic body, in particular for producing a faceted mirror. The invention also relates to a faceted mirror produced by the method.

U.S. Pat. No. 4,277,141 discloses a method by which a multifaceted mirror is produced in several steps, to be specific individual mirrors are created in a first step, and the individual mirrors are subsequently fixed and aligned and are bonded to a supporting body by means of an adhesive.

U.S. Pat. No. 4,195,913 discloses a faceted mirror in which a multiplicity of individual mirrors are adhesively bonded or screwed on a spherical support structure.

In U.S. Pat. No. 6,166,868 there is a description of an optical mount for an optical component, an inner part being connected to an outer frame by a plurality of resilient articulated bars. The resilient articulated bars are produced galvanoplastically.

The present invention is based on the object of providing a method of connecting a multiplicity of optical elements of the type mentioned at the beginning, it being possible for the multiplicity of optical elements to be arranged on the basic body with high accuracy, in particular with respect to position and angularity, so that for example beam mixing and field imaging operations can be performed with high precision.

The present invention is based on the object of forming a faceted mirror with a multiplicity of individual optical mirror elements which produces a homogeneous lighting distribution or homogeneous illumination and very exact beam mixing and field imaging.

SUMMARY OF THE INVENTION

The object is achieved according to the invention by the method of joining together a multiplicity of optical elements on a basic body, the individual optical elements being positioned on the basic body and subsequently connected to the basic body by a galvanoplastic joining technique. A faceted mirror produced by the method according to the invention is described as a method of connecting a multiplicity of optical elements to a basic body, in particular for producing a faceted mirror, for example for beam mixing and field imaging for an EUV lighting system, the multiplicity of optical elements being aligned on an auxiliary structure and the optical elements subsequently being made to grow together galvanoplastically on their rear sides, forming a supporting structure as the basic body. The auxiliary structure is formed by a plurality of parts with spacers or positioners lying in-between.

By the method according to the invention, a multiplicity of individual optical elements, which may be of a completely identical form, can be connected to one another and to a basic body in a relatively simple way and very precisely by the galvanoplastic process. Since exactly reproducible conditions are created by the galvanoplastic process, in this way it is possible for example to form a faceted mirror which permits the homogeneous illumination of a field, thereby making correspondingly good beam mixing and exact field imaging possible.

With the method according to the invention, a beam mixing or lighting which eliminates the disadvantageous higher light intensity in the medium range is achieved. This is of advantage in particular in optical lithography with an EUV lighting system, in which for example it is desirable to have on the reticle (mask) a homogeneously illuminated area that is as large as possible.

It is possible for the method according to the invention to be realized by two production principles:

1. The optical elements may be connected to the basic body by a galvanoplastic joining technique, in which the basic body may also be galvanically formed.

In the case of galvanic forming of the basic body, the latter is created in such a way that it includes the position of the facets, but not their surface quality, on the supporting body. The required surface quality is then realized by the optical elements, for example mirror elements, which after placement on the basic body are connected to the latter by growing together galvanically. The galvanic connection achieves not only precise, full-area and consequently very exact positioning and connection but also very good heat conduction for the rapid heat removal from the mirror elements into the basic body.

2. On an auxiliary structure which represents the negative form of the optical part to be produced, for example of a faceted mirror, the optical elements are for example fixed by an adhesive or a resin, in the production of a faceted mirror from mirror elements their mirrored sides being directed toward the auxiliary structure. In this case, the exact position and alignment of the optical elements is defined by the auxiliary structure. By this type of fixing, the optical surfaces directed toward the auxiliary structure, such as for example the mirror surfaces, are also protected from contaminants during the subsequent galvanoplastic process.

As soon as all the elements have been brought into position, the complete unit is cathodically connected in a bath and the optical elements are bonded into a body which is building up or growing up.

If lenses are used as optical elements, they are fixed on one of the optical surfaces. The second optical surface must in this case then be separately protected from contaminants. Lenses or nonconducting mirror elements must be made electrically conductive in advance by a corresponding coating.

In advantageous developments of the invention, it may be provided that cooling and/or reinforcing devices are incorporated into the growing body during the galvanoplastic process.

The method according to the invention forms virtually a monolithic body which, by good heat transfer of the individual optical elements to the basic body, makes efficient cooling of the optical element possible.

BRIEF DESCRIPTION OF THE DRAWINGS

Further advantageous refinements and developments of the invention emerge from the subclaims and from the exemplary embodiments described in principle below with reference to the drawing, in which:

DETAILED DESCRIPTION OF THE PREFERRED EMBODIMENTS

Figure 1:
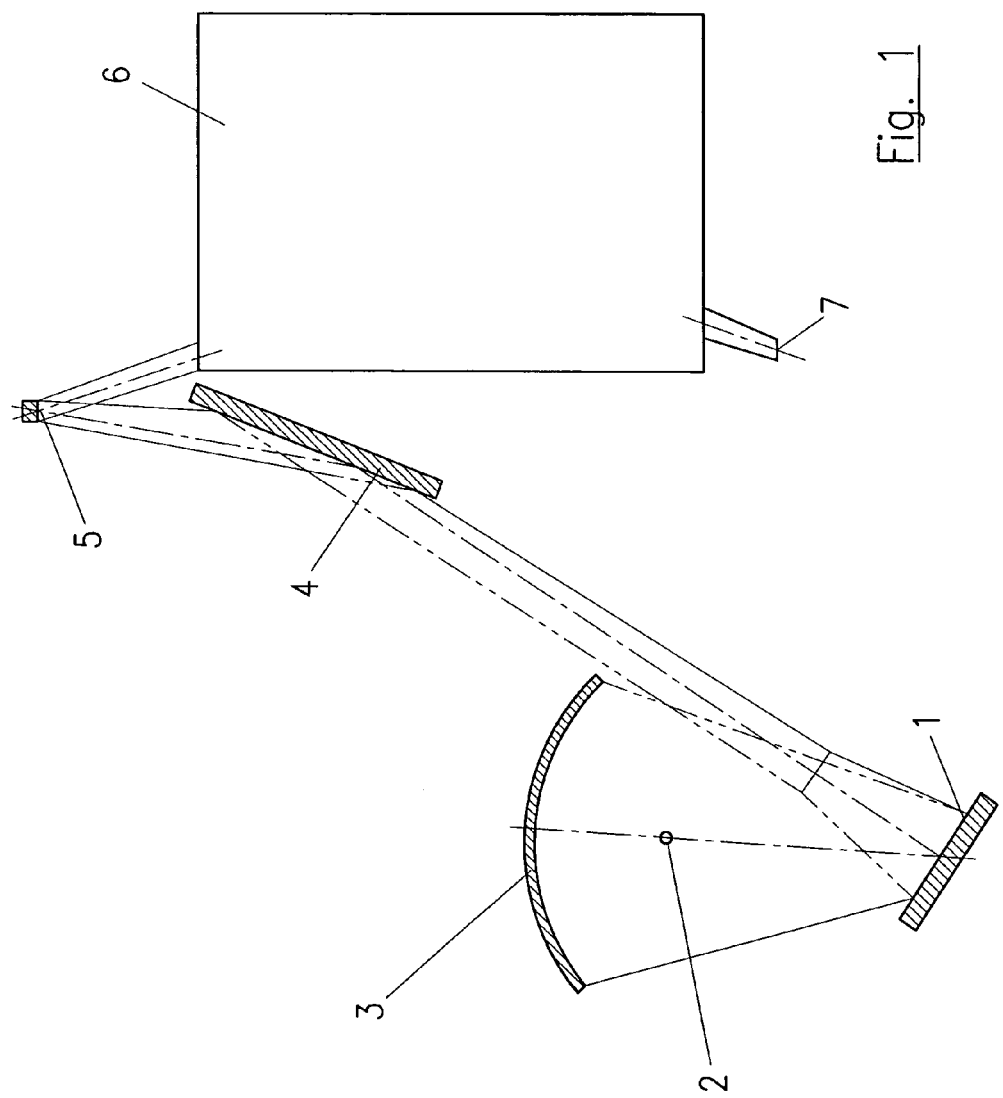
FIG. 1 shows a basic representation of a faceted mirror according to the invention, arranged in an EUV lighting system for microlithography.

A method of producing a faceted mirror and a faceted mirror produced by the method are described by way of example below. In principle, however, the method is also suitable for connecting or joining together other optical elements, such as lenses and lens arrays for example. In FIG. 1, the use of a faceted mirror 1 in a lighting system for EUV lithography is represented. The light of a source 2, for example of a laser, is cast via a collector mirror 3 onto the faceted mirror 1, where it is fed with the desired uniform illumination via a deflecting mirror 4 to a reticle (mask) 5. The pattern of the reticle 5 is passed via a projection lens system 6 not represented in any more detail to a wafer 7 for the imaging of the image of the reticle 5.

Figure 2:
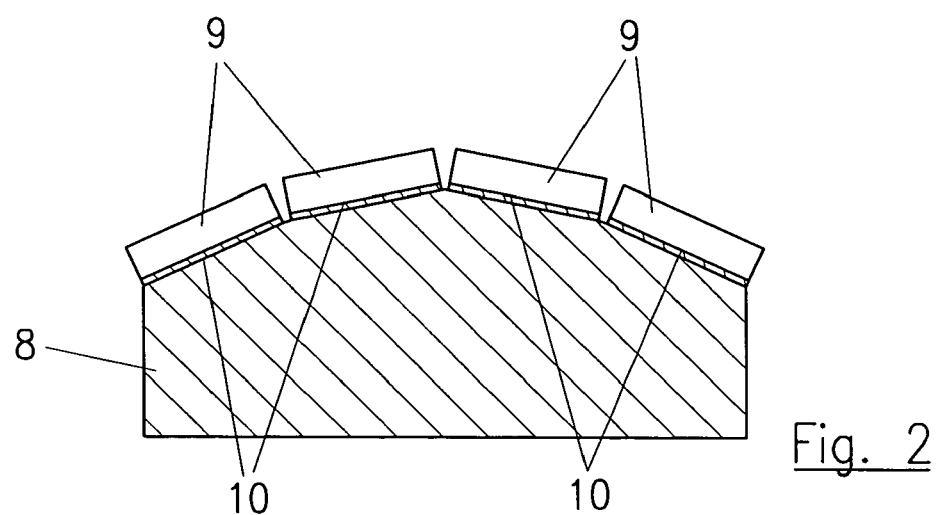
FIG. 2 shows a first method of production for a faceted mirror.

The production of the faceted mirror 1 with correspondingly high precision and homogeneous or as-desired illumination takes place according to FIG. 2 on a basic body 8. The basic body 8 may be formed for example by galvanic means, its functional surface corresponding with respect to curvature and position to the requirements which the finished faceted mirror 1 has to meet. Only the surface quality is still lacking. The surface quality is then realized by individual mirror elements 9 as optical elements.

In the case of the present invention, as a modification of normal galvanoforming, a multiplicity of mirror elements, for example 200 to 300 elements, are produced in advance by a conventional production process, such as milling, grinding and polishing for example. A multiplicity of identical mirror elements are subsequently brought into position and alignment on the basic body 8 and then connected to one another by a following galvanoplastic process. In this way, a faceted mirror is finally obtained as virtually a single monolithic part in an extremely precise form.

By producing many identical mirror elements, the production of a faceted mirror is also facilitated, simplified and reduced in cost. Mirror elements of poor quality can be segregated in advance, or mirror elements 9 which are identical or virtually identical, in particular with respect to their optical properties, may be selected.

Galvanoplastic processes are generally known, for which reason they are not discussed in any more detail here. In principle, this takes place by the mirror elements 9 being brought into their position on the basic body 8 and the entire unit then being cathodically connected in an electrolytic bath and the desired material, for example Cu or Ni, being used as the anode, so that the parts can grow together to form one unit. In this way, for example, the growing on of an intermediate layer 10, such as a copper layer of any desired thickness can be achieved.

In principle, all conductive materials or materials which can be made conductive by coating come into consideration as materials for the mirrors. For EUV lighting systems, it should also be ensured that polishing to the required surface quality (0.2 to 0.3 nm RMS) is possible. In addition, the material should have good heat conductivities. For the reasons mentioned above, copper coated with nickel is generally used as the facet material.

The mirror elements 9 placed on the basic body 8 are connected to the basic body 8 by a galvanoplastic joining technique, as indicated by an intermediate layer 10 between the mirror elements 9 and the basic body 8.

Figure 3:
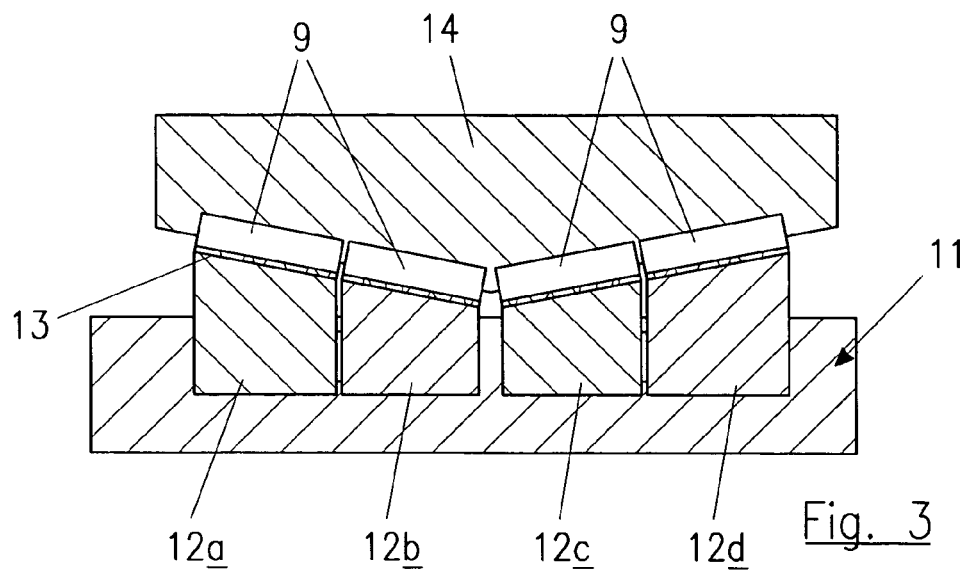
FIG. 3 shows a second method of production for a faceted mirror.

As an alternative to this, according to FIG. 3, an auxiliary structure 11 may be provided for the positioning of the mirror elements 9. For more accurate adaptation, the auxiliary structure may be made up of a plurality of individual dies 12a, 12b, 12c . . . , which together form a surface in negative form for the faceted mirror to be produced and, in the case of a spherical surface, lie correspondingly at a distance from one another, or provide intermediate gaps for reasons of space.

The mirror elements are fixed with their mirrored side on the auxiliary structure 11, for example by an adhesive or a resin 13. By this type of alignment and fixing, the mirror surfaces of the mirror elements 9 are protected from contaminants during the subsequent galvanoplastic process. Once all the mirror elements 9 have been brought into position, the complete device is cathodically connected in an electrolytic bath and the elements are connected to one another in a growing body, which consequently forms a supporting structure 14 for the individual mirror elements 9, or are bonded into the body produced.

When forming lens arrays, the individual lenses are likewise respectively fixed by one of the optical surfaces on the auxiliary structure 11. The second optical surfaces must then be separately protected from contaminants. Lenses or nonconducting mirror elements must be made electrically conductive in advance by a corresponding coating.

Figure 4:
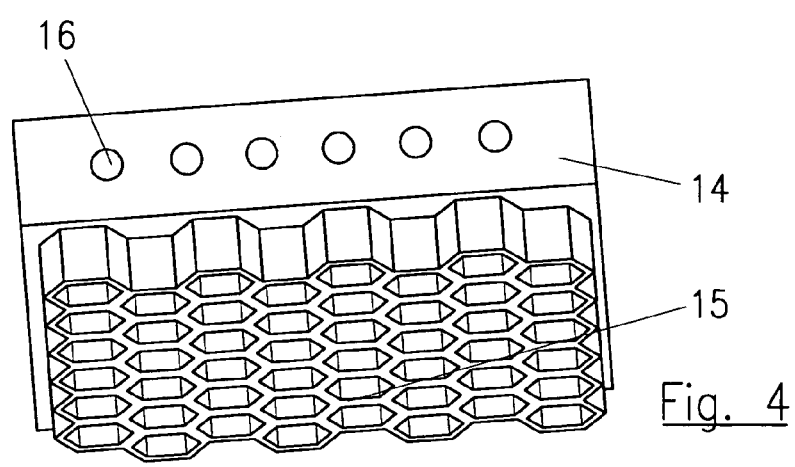
FIG. 4 shows a basic body for a faceted mirror with reinforcements in a honeycomb structure and with cooling channels.

After the completion of a sufficiently strong supporting structure 14, reinforcing structures can be incorporated by galvanic means subsequently or else at the same time as the growing takes place, or they can be correspondingly made to grow up. In FIG. 4, a honeycomb structure 15 (without mirror elements) for reinforcing the supporting structure 14 is represented.

It can be additionally seen from FIG. 4 that the supporting structure 14 may be provided with a cooling system in the form of cooling channels 16.

The cooling channels 16 can be formed during the galvanoplastic process. For this purpose, it is only necessary to provide corresponding wax inserts in serpentine form, these inserts subsequently being melted out.

A further solution may comprise placing a copper tube on in a serpentine form and then allowing it to grow in during the galvanoplastic process. In this way, a very good heat transfer is then obtained on account of metallic bonding.

It goes without saying that combinations are also possible. The same applies for example to the forming of the supporting structure 14 with the honeycomb structure 15, into which cooling channels 16 may likewise be formed, or else the honeycombs themselves may serve for cooling.

What is claimed is:

1. A method of joining together a multiplicity of optical elements on a basic body, comprising:
    positioning a plurality of individual optical elements on a basic body;
    connecting the plurality of the individual optical elements to the basic body by a galvanoplastic joining technique;
    wherein the optical elements comprise mirror facets; and
    wherein the mirror facets comprise copper.

2. The method as claimed in claim 1, wherein the basic body is galvanically formed.

3. The method as claimed in claim 1, wherein the mirror facets are used for beam mixing and field imaging for an EUV lighting system.

4. The method as claimed in claim 3, wherein the EUV lighting system comprises a light source, and further comprising directing the light source onto the mirror facets and to a reticle.

5. The method as claimed in claim 1 wherein the positioning comprises providing a number of the optical elements ranging from 200 to 300 optical elements.

6. The method as claimed in claim 1 further comprising polishing the mirror facets to a surface quality ranging from 0.2 to 0.3 nm RMS.

7. The method as claimed in claim 1 wherein the mirror facets comprise copper coated with nickel.

8. The method as claimed in claim 1, wherein the connecting of the plurality of the individual optical elements form a single monolithic structure.

9. The method as claimed in claim 1, further comprising providing the plurality of the individual optical elements as substantially identical optical elements with regard to optical properties.

10. A method of joining together a multiplicity of optical elements on a basic body, comprising:
    positioning a plurality of individual optical elements on a basic body;
    connecting the plurality of the individual optical elements to the basic body by a galvanoplastic joining technique;
    wherein the optical elements comprise mirror facets; and
    polishing the mirror facets to a surface quality ranging from 0.2 to 0.3 nm RMS.

* * * * *